United States Patent [19]
Kowaguchi

[11] Patent Number: 5,506,546
[45] Date of Patent: Apr. 9, 1996

[54] METHOD AND APPARATUS FOR GENERATING TRANSMITTING WAVE

[75] Inventor: Satoshi Kowaguchi, Tokyo, Japan

[73] Assignee: NEC Corporation, Tokyo, Japan

[21] Appl. No.: 490,707

[22] Filed: Jun. 15, 1995

[30] Foreign Application Priority Data

Jun. 20, 1994 [JP] Japan .................................. 6-160583

[51] Int. Cl.⁶ .............................. H03C 1/06; H03C 3/00; H03C 5/00; H04L 27/00
[52] U.S. Cl. .............................. 332/103; 375/296; 455/63
[58] Field of Search .................................... 332/100, 103, 332/107, 125, 159; 375/254, 285, 296–298, 300, 302; 455/63, 116

[56] References Cited

U.S. PATENT DOCUMENTS 4,580,111   4/1986   Swanson .................................. 332/152

FOREIGN PATENT DOCUMENTS 57-140008   8/1982   Japan.
58-24056    5/1983   Japan.

*Primary Examiner*—David Mis
*Attorney, Agent, or Firm*—Whitham, Curtis, Whitham & McGinn

[57] ABSTRACT

In a method for generating a transmitting wave, a power supply voltage to be supplied to a transmission power amplifier is detected by a voltage detector, and a modulating signal is controlled so that a peak value of a modulated wave is lowered in accordance with a reduction amount of the power supply voltage. Since the peak value of the modulated wave input to the power amplifier is lowered, it is possible to obtain a transmitting wave without a distortion of the wave form or an increased bandwidth even when the reduction in the power supply voltage involves the lowering of the driving capability of the power amplifier.

29 Claims, 10 Drawing Sheets

TRANSMITTING DATA
(BINARY DIGITAL)

MODULATING
SIGNAL Sm

MODULATED WAVE St
WHEN Vcc IS NORMAL

MODULATED WAVE St
WHEN Vcc IS REDUCED

TRANSMITTING WAVE
WHEN NO PEAK FACTOR
CONTROL

METHOD AND APPARATUS FOR GENERATING TRANSMITTING WAVE

BACKGROUND OF THE INVENTION

1. Field of the Invention

The present invention relates to a transmitter having a power supply, and more particularly to a method and an apparatus for generating a transmitting wave without deteriorating transmission characteristics due to a reduction in a power supply voltage.

2. Description of the Related Art

In mobile communication equipment, a reduction in power supply voltage adversely influences the radio transmission characteristics. Especially, to almost all the digital modulations in practice such as 16QAM, pi/4 QPSK and a multi-carrier 16QAM having an amplitude modulation component, the reduction in power supply voltage may lead to significant problems, for example, communication impossibility.

A general circuit configuration of a digital modulation transmitter is shown in FIG. 1. A modulating signal generator 1 generates a modulating signal Sm on the basis of transmitting data, and a digital modulator 2 modulates a carrier wave in accordance with the modulating signal Sm. A modulated wave St is amplified by a transmission power amplifier 3 and is transmitted to the air through an antenna. Power is supplied from a constant-voltage power supply 4 to the transmission power amplifier 3.

Almost all the digital modulations in practice have an amplitude modulation component, and a momentary maximum value (a peak value) thus exists in the transmitting wave. Therefore, the transmission power amplifier 3 requires a power which can cope with this peak value. In the 16QAM, for example, since the transmission power amplifier 3 requires 10 Watts of power in order to obtain 1 Watt of an average transmitting power, a larger power is necessary to deal with the peak value.

When the power supply voltage of the transmitter is lowered to a value which the constant-voltage power supply 104 can not deal with, however, the power amplifier 3 can not output the peak value of the transmission output. In such a case, an error rate slightly deteriorates only if the amplitude component is just restricted, but the communication system is significantly influenced by increasing in the noise from outside a channel (or the leakage power to an adjacent channel and the like) generated by a phase error or a distortion which is caused due to the passage having non-linear characteristics. When using a feedback loop in a transmission control system, there is a possibility such that the loop is opened at the time of the peak to involve a control failure, leading to defective communication in some cases.

In order to solve such a problem, the amplitude component must be controlled before the peak value is restricted by the power amplifier so that no distortion or the like of the transmission output is generated. If the amplitude component is tried to be controlled by using the modulated wave St, since there exists a limitation such that a filter for an extremely narrow bandwidth is necessary, this is not a realistic solution.

Further, there have been proposed several methods for controlling the power supplied to a power amplifier. For example, in Japanese patent laid-open publication No. Sho 57-140008, an audio power amplifying circuit is disclosed which controls the output voltage of the variable-voltage power supply in accordance with a detected peak level of an output signal. In Japanese patent laid-open publication No. Sho 58-24056, a mobile station is disclosed which is provided with a current controller for controls current supplied to a transmission power amplifier depending on whether a modulating signal is received or not.

However, the above conventional methods are intended to save the consumption power or improve the effective use of the same but do not suggest a configuration for eliminating the above-described problem.

SUMMARY OF THE INVENTION

It is an object of the present invention to provide a method and an apparatus for generating a transmitting wave without deteriorating the transmission characteristics even when the power supply voltage is lowered.

It is another object of the present invention to provide a transmitter having stable transmission characteristics with a simple structure.

According to the present invention, a modulated wave including at least an amplitude component is changed in a peak amplitude in accordance with a voltage reduction of a power supply by controlling a modulating signal. More specifically, a power supply voltage of the power supply is detected by a voltage detector at predetermined intervals or when the transmitter is switched on. Based on the power supply voltage, an amplitude limit of the modulated wave is calculated using amplitude reduction factors each corresponding to a power supply voltage. The modulating signal is generated such that an amplitude of the modulated wave is restricted within the amplitude limit. According to the modulating signal, modulation is performed to generate the modulated wave.

In a modulation where the modulating signal has no amplitude component of the modulated wave, such as quadrature modulation, the modulating signal is preferably generated as follows. First, an estimated amplitude of the modulated wave is calculated based on the transmitting data and is compared with the amplitude limit. In cases where the estimated amplitude is greater than the amplitude limit, the modulating signal is changed based on a ratio of the amplitude limit to the estimated amplitude. Alternatively, a step of compressing the estimated amplitude is repeated until the estimated amplitude is compressed within the amplitude limit, and the modulating signal is changed based on the compressed amplitude.

As described above, the modulating signal is generated such that its amplitude value is adjusted in accordance with the reduction in the power supply voltage before entering a modulator. Therefore, the modulated wave is generated in such manner that the power amplification is enabled within the driving capability of a power amplifier even when the power supply voltage decreases, and the transmission characteristics can be stabilized without producing the larger bandwidth or the increased phase error rate due to the distortion of a transmitting wave form as in the prior art.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Preferred embodiments of the present invention will now be described hereinbelow in detail with reference to the drawings.

Quadrature Modulation Transmitter

Figure 1:
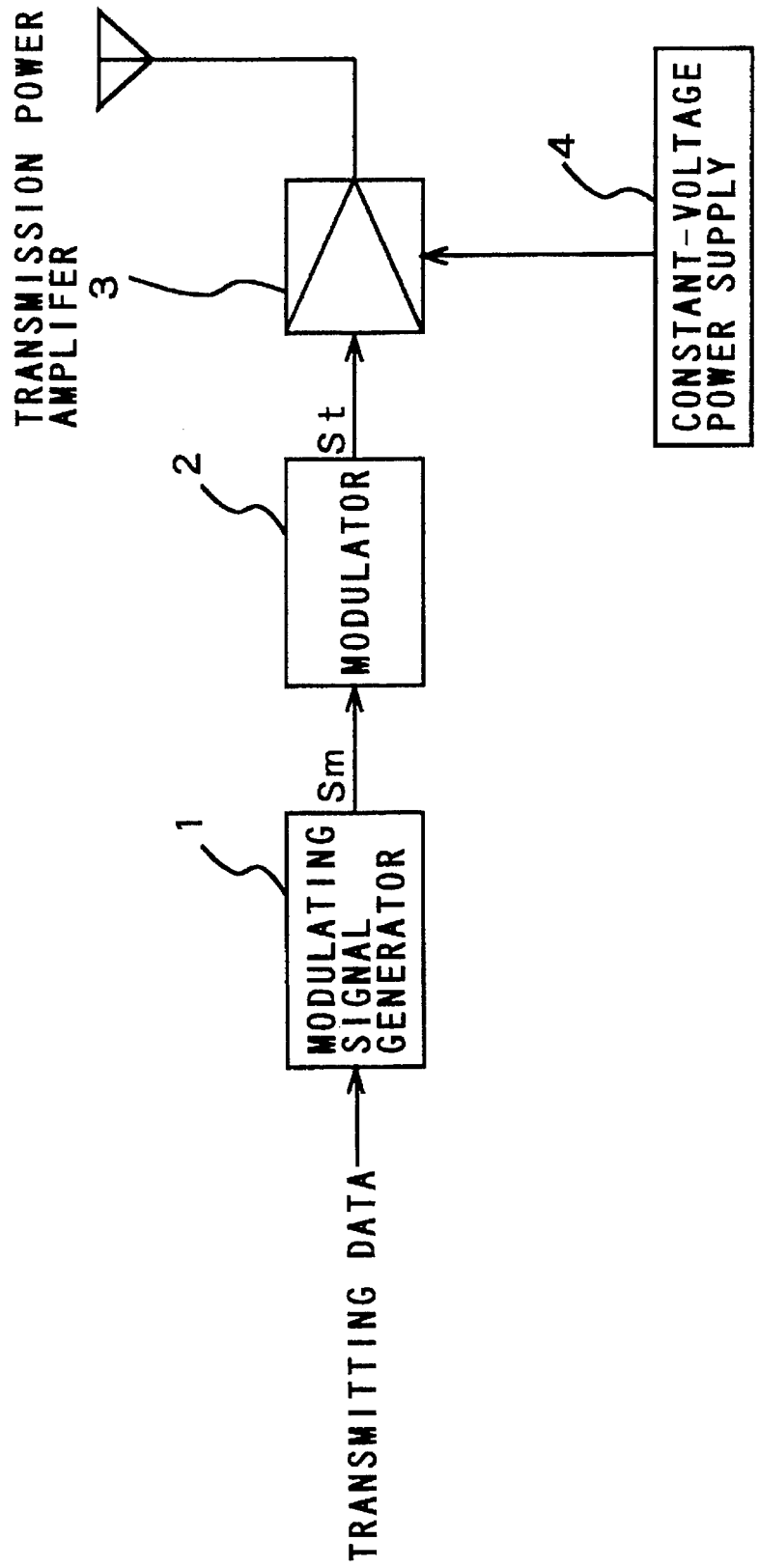
FIG. 1 is a block diagram showing one example of a conventional radio transmitter.
Figure 2:
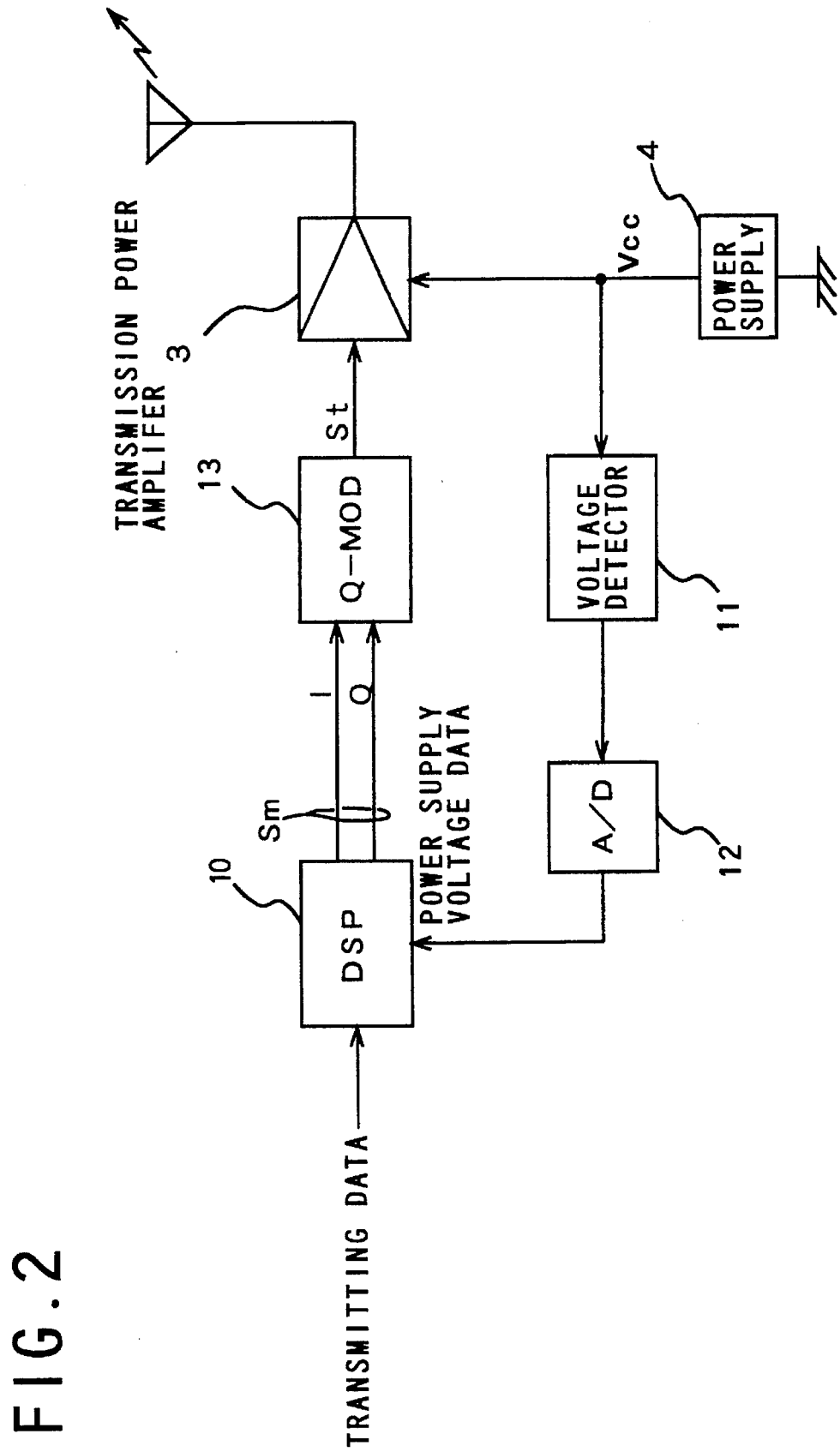
FIG. 2 is a schematic block diagram showing a first embodiment of a transmitter according to the present invention.

As illustrated in FIG. 2, inputting transmitting data, a digital signal processor (DSP) 10 generates a modulating signal Sm comprising I and Q components. The DSP 10 has a read-only memory (ROM) therein which stores a program for generating a modulating signal Sm in accordance with the transmitting data and a power supply voltage Vcc as described later. The output voltage Vcc of the power supply 4 is detected by a voltage detector 11 and is converted from analog to digital by an A/D converter 12.

A quadrature modulator 13 modulates a carrier wave in accordance with the modulating signal Sm and outputs a modulated wave St to a transmission power amplifier 3. The transmission power amplifier 3 amplifies the modulated wave St to generate a transmitting wave using the power supplied from the power supply 4.

Figure 3:
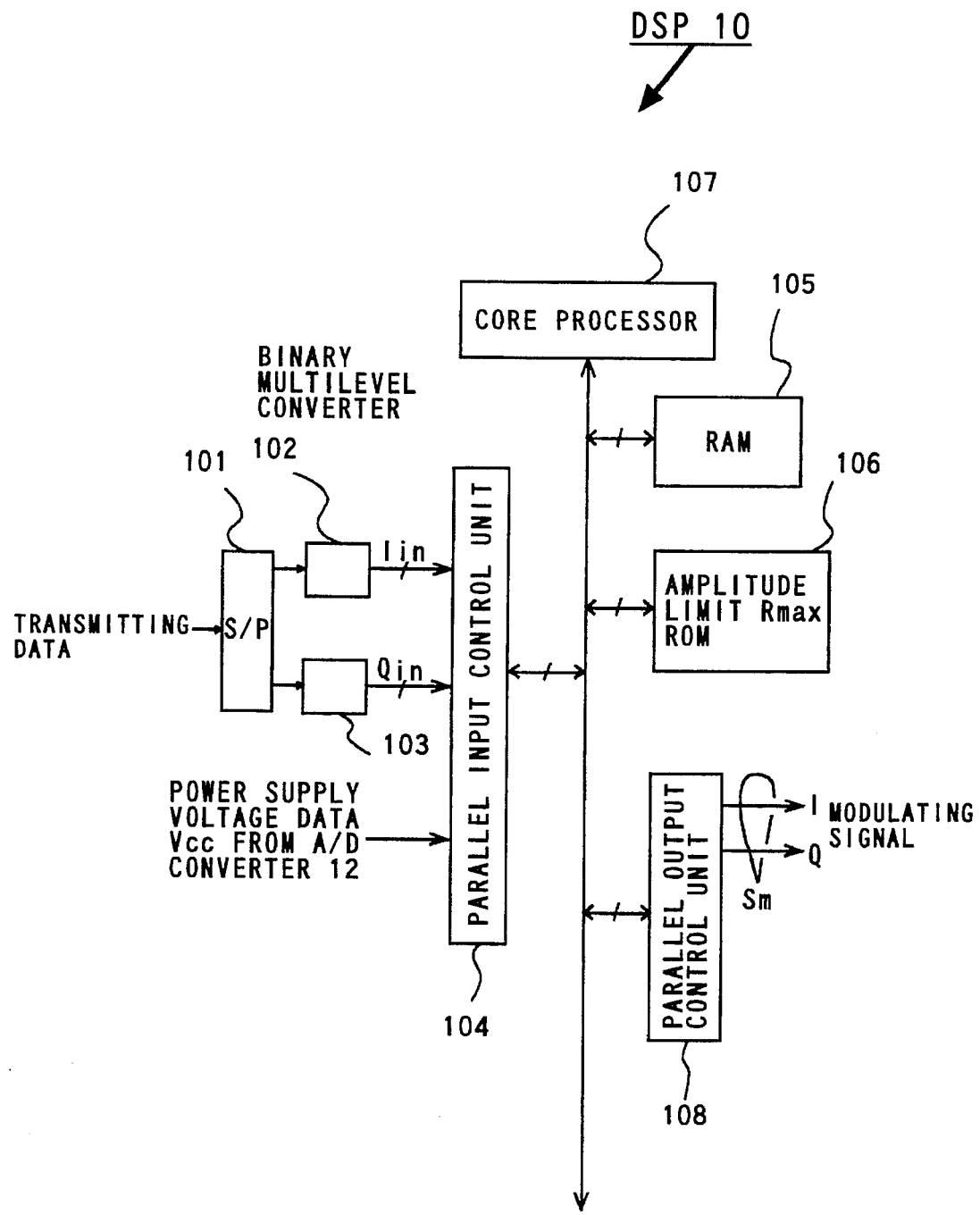
FIG. 3 is a detailed block diagram illustrating a digital signal processor employed in the present embodiment of FIG. 2.

As shown in FIG. 3, the DSP 10 inputs the transmitting data and the power supply voltage data Vcc, and outputs the modulating signal Sm comprising I and Q components. The transmitting data is converted to parallel data by a serial-parallel converter 101 and the parallel data is further converted to digital input signals $I_{in}$ and $Q_{in}$ by binary-multi-level converters 102 and 103, respectively. The input signals $I_{in}$ and $Q_{in}$ and the power supply voltage data Vcc are input through a parallel input control unit 104.

The DSP 10 is further comprised of a random access memory (RAM) 105, a ROM 106, a core processor 107, and a parallel output control unit 108. The ROM 106 stores amplitude reduction factors x (dB) in respect to an average power level $P_{av}$ of the modulated wave St, each amplitude reduction factor corresponding to the power supply voltage data Vcc. The core processor 107 has a program ROM therein for performing a peak factor control by which the amplitude limit data Rmax is calculated and the modulating signal Sm is obtained as described hereinafter.

Peak Factor Control

The DSP 10 generates the modulating signal Sm so that a peak value of the modulated wave St is lowered in accordance with a reduction amount of the power supply voltage Vcc. Such a peak value control is referred to as a peak factor control hereinbelow, and a peak factor Fp is defined as "a ratio of a peak power level $P_p$ with respect to an average power level $P_{av}$ of the modulated wave St ($F_p = P_p/P_{av}$)" (See FIG. 6A).

Figure 4:
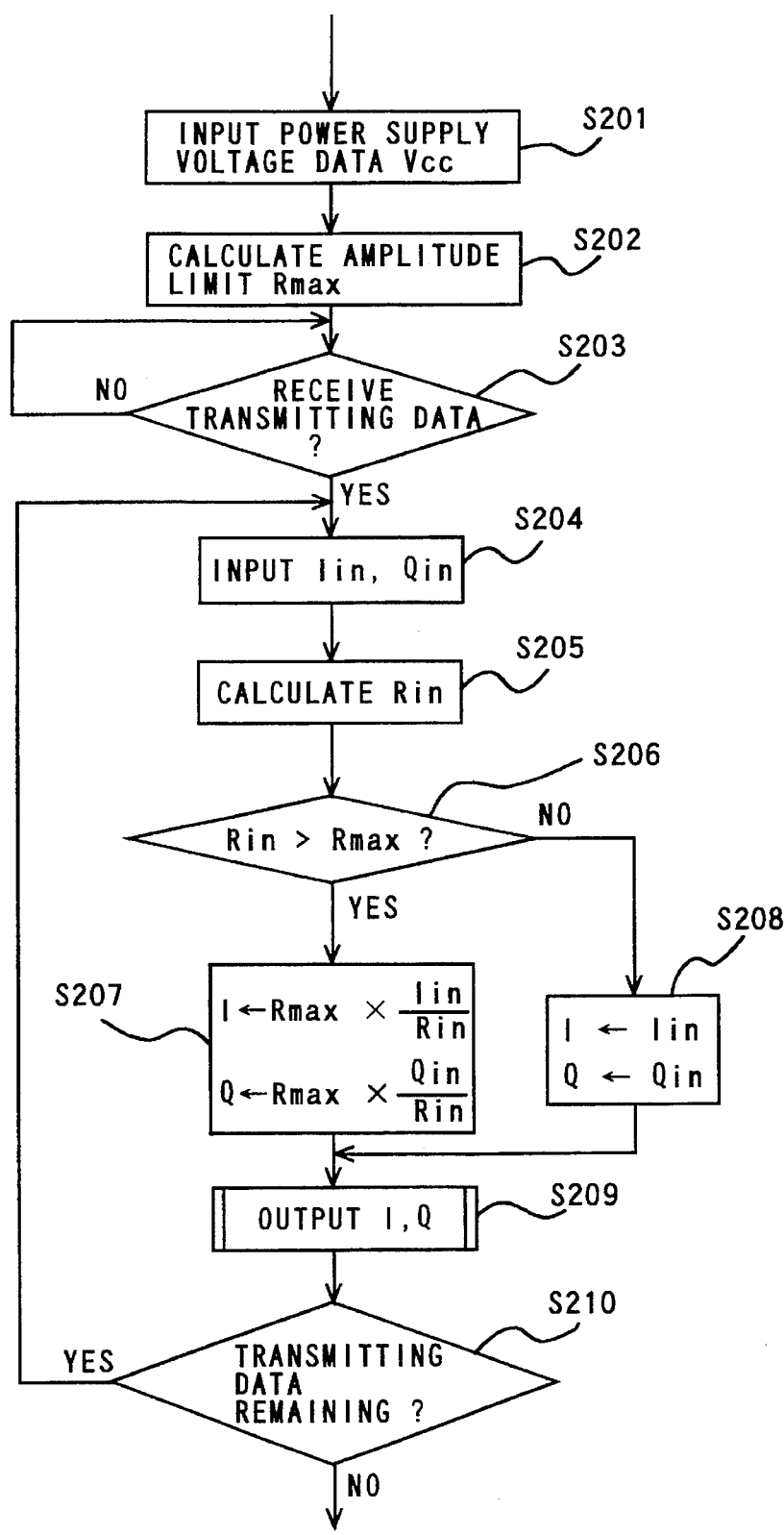
FIG. 4 is a flowchart showing a peak factor control in a first embodiment of a method for generating a modulating signal according to the present invention.

FIG. 4 illustrates a first example of the peak factor control. Receiving the power supply voltage data Vcc from the A/D converter 12 (S201), the core processor 107 reads the amplitude reduction factor x (dB) from the ROM 106, calculates the amplitude limit Rmax using the following equation (S202):

$$\text{Rmax} = (P_{av} \times 10^{x/10})^{1/2},$$

and stores the result Rmax onto the RAM 105.

Receiving the transmitting data (Yes in S203), the core processor 107 inputs the digital input signals $I_{in}$ and $Q_{in}$ (S204) and calculates an estimated amplitude $R_{in}(t)$ using the following equation (S205):

$$R_{in}(t) = (I_{in}(t)^2 + Q_{in}(t)^2)^{1/2}.$$

Subsequently, it is determined whether the estimated amplitude $R_{in}(t)$ is greater than the amplitude limit Rmax (S206). If $R_{in}(t) > \text{Rmax}$, the peak reduction of the modulating signal Sm is performed using the following equations (S207):

$$I(t) = \text{Rmax} \times I_{in}(t)/R_{in}(t)$$

$$Q(t) = \text{Rmax} \times Q_{in}(t)/R_{in}(t).$$

On the other hand, if $R_{in}(t)$ is not larger than Rmax, the modulating signal Sm is obtained using the input signals $I_{in}$ and $Q_{in}$ (S208) because the transmission power amplifier 3 can amplify the modulated wave St to a sufficient degree.

In such a manner, the modulating signal Sm is calculated and output to the modulator 13 (S209). If any transmitting data is remaining, the above steps are repeated until all the transmitting data are converted to the modulating signal Sm (S210).

It should be noted that the detection of the power supply voltage Vcc is performed at predetermined intervals or when the transmitter is switched on.

Figure 5:
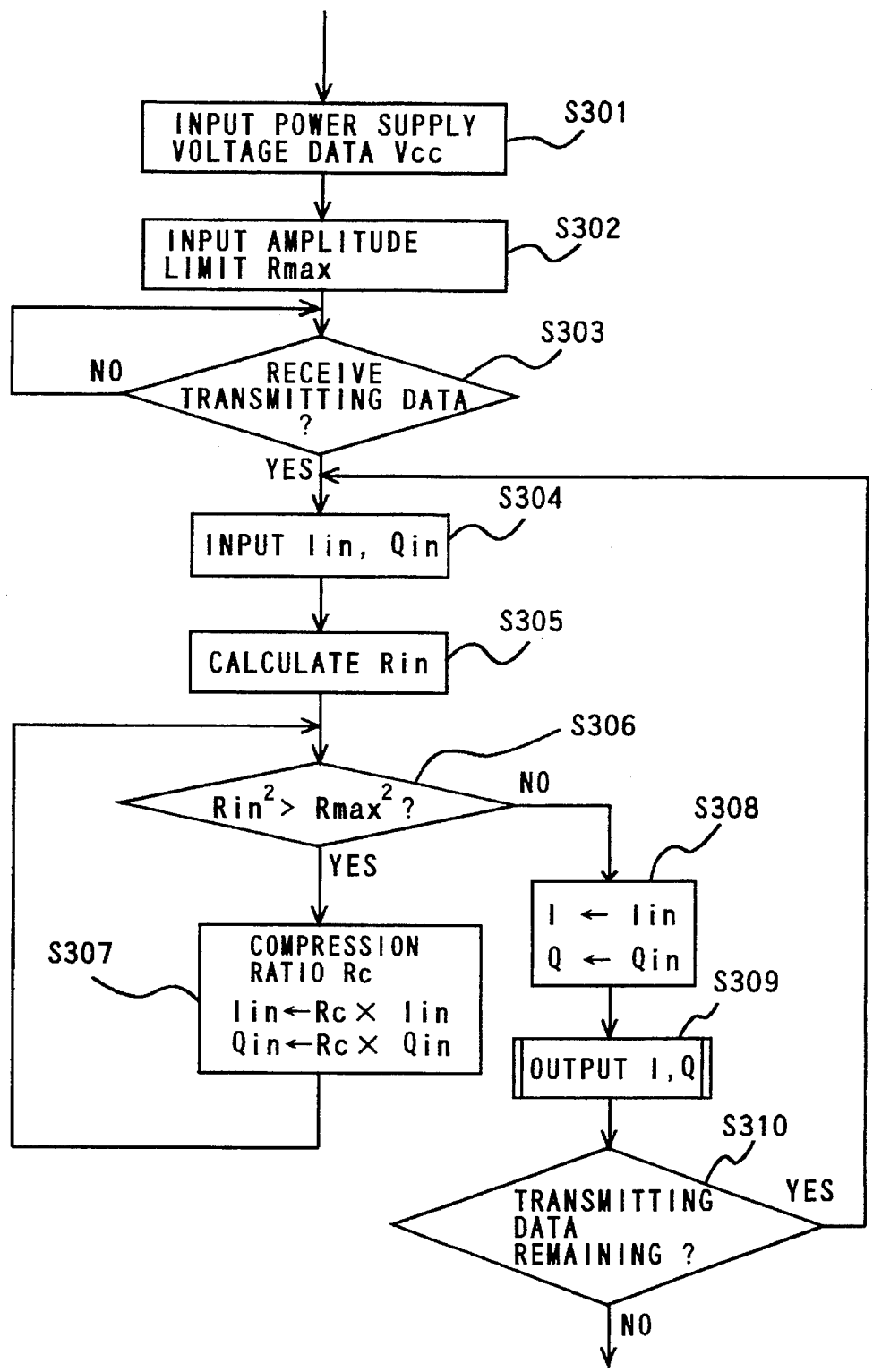
FIG. 5 is a flowchart showing a peak factor control in a second embodiment of a method for generating a modulating signal according to the present invention.

FIG. 5 illustrates a second example of the peak factor control. Receiving the power supply voltage data Vcc from the A/D converter 12 (S301), the core processor 107 reads the amplitude reduction factor x (dB) from the ROM 106, calculates the amplitude limit Rmax using the following equation (S302):

$$\text{Rmax} = (P_{av} \times 10^{x/10})^{1/2},$$

and stores the result Rmax onto the RAM 105.

Receiving the transmitting data (Yes in S303), the core processor 107 inputs the digital input signals $I_{in}$ and $Q_{in}$ (S304) and calculates an estimated amplitude $R_{in}(t)$ using the following equation (S305):

$$R_{in}(t)=(I_{in}(t)^2+Q_{in}(t)^2)^{1/2}.$$

Subsequently, it is determined whether the estimated amplitude $R_{in}(t)$ is greater than the amplitude limit Rmax (S306). If $R_{in}(t)^2$>Rmax$^2$, the peak reduction of the modulating signal Sm is performed using the following equations (S307):

$$I(t)=Rc\times I_{in}(t)$$

$$Q(t)=Rc\times Q_{in}(t),$$

where Rc is an appropriate compression ratio. Such a peak reduction step (S307) is repeated until the estimated amplitude $R_{in}$ is equal to or smaller than the amplitude limit Rmax.

If $R_{in}(t)^2$ is not larger than Rmax$^2$, the modulating signal Sm is obtained using the input signals $I_{in}$ and $Q_{in}$ (S308) because the transmission power amplifier 3 can amplify the modulated wave St to a sufficient degree.

In such a manner, the modulating signal Sm is calculated and output to the modulator 13 (S309). If any transmitting data is remaining, the above steps are repeated until all the transmitting data are converted to the modulating signal Sm (S310).

Figure 6A:
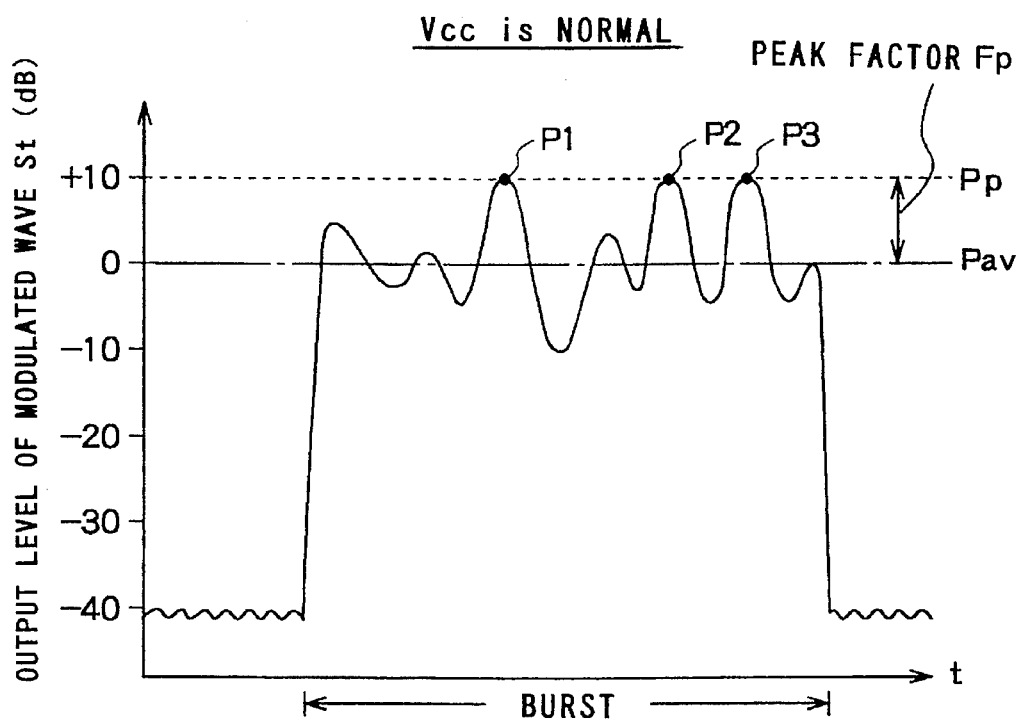
FIG. 6(A) is a wave form chart illustrating a power level of a transmitting wave in a case when the power supply voltage is not lowered.
Figure 6B:
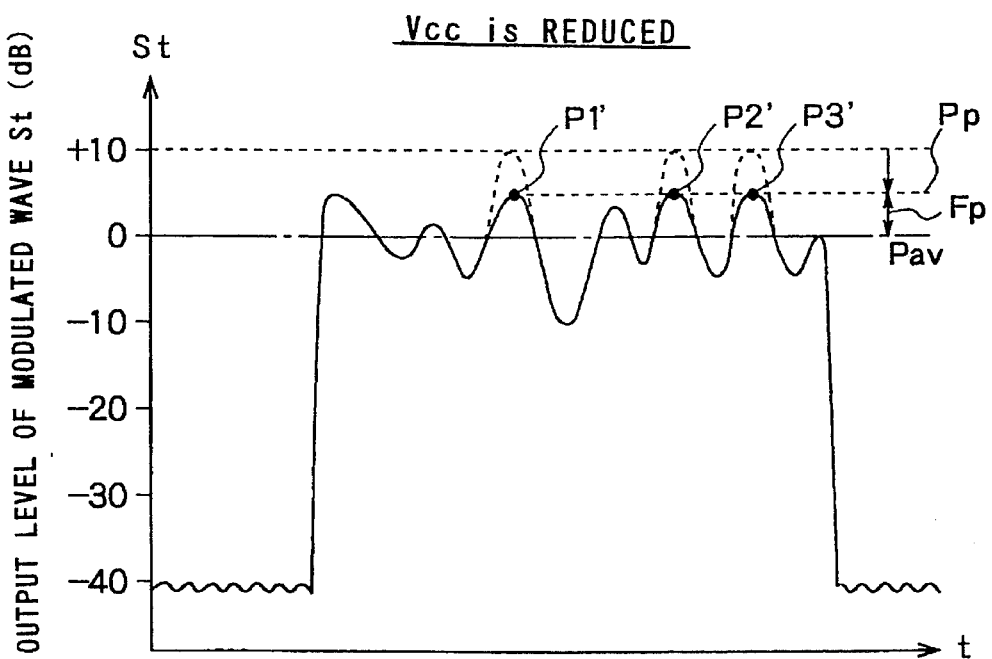
FIG. 6(B) is a wave form chart illustrating a power level of a transmitting wave in a case when the power supply voltage is lowered.

FIG. 6A shows output level variations of the modulated wave St in a case when the power supply voltage Vcc is not lowered and FIG. 6B shows the output level variations in a case when the power supply voltage Vcc is lowered. It is to be noted that there is illustrated an exemplary signal transmitted in the burst manner, Since sufficient power is supplied to the transmission power amplifier 3 when the power supply voltage Vcc is not lowered, the DSP 10 generates and outputs a normal modulating signal Sm to the quadrature modulator 13 in accordance with the transmitting data. By this operation, as shown in FIG. 6A, the output level of the modulated wave St has a wave form including high level peak values P1, P2 and P3.

When the power supply voltage Vcc is lowered, the DSP 10 generates the modulating signal Sm under the peak factor control such that the peak factor Fp is lowered in accordance with its reduction amount as described in FIGS. 4 and 5. Quadrature-modulating the carrier wave by using such a modulating signal Sm involves the reduction in the peak values P1, P2 and P3 of the modulated wave St to become P1', P2' and P3', as shown in FIG. 6B.

In this way, the reduction in the peak factor Fp results in the power amplification of the modulated wave St within the driving capability of the transmission power amplifier 3, eliminating the widening of the bandwidth of the transmitting wave due to the conventional fact that the power amplification is performed beyond the driving capability and thereby stabilizing the transmission characteristics. This point will be again described in connection with FIGS. 10A–10E.

Polar Modulation Transmitter

Figure 7:
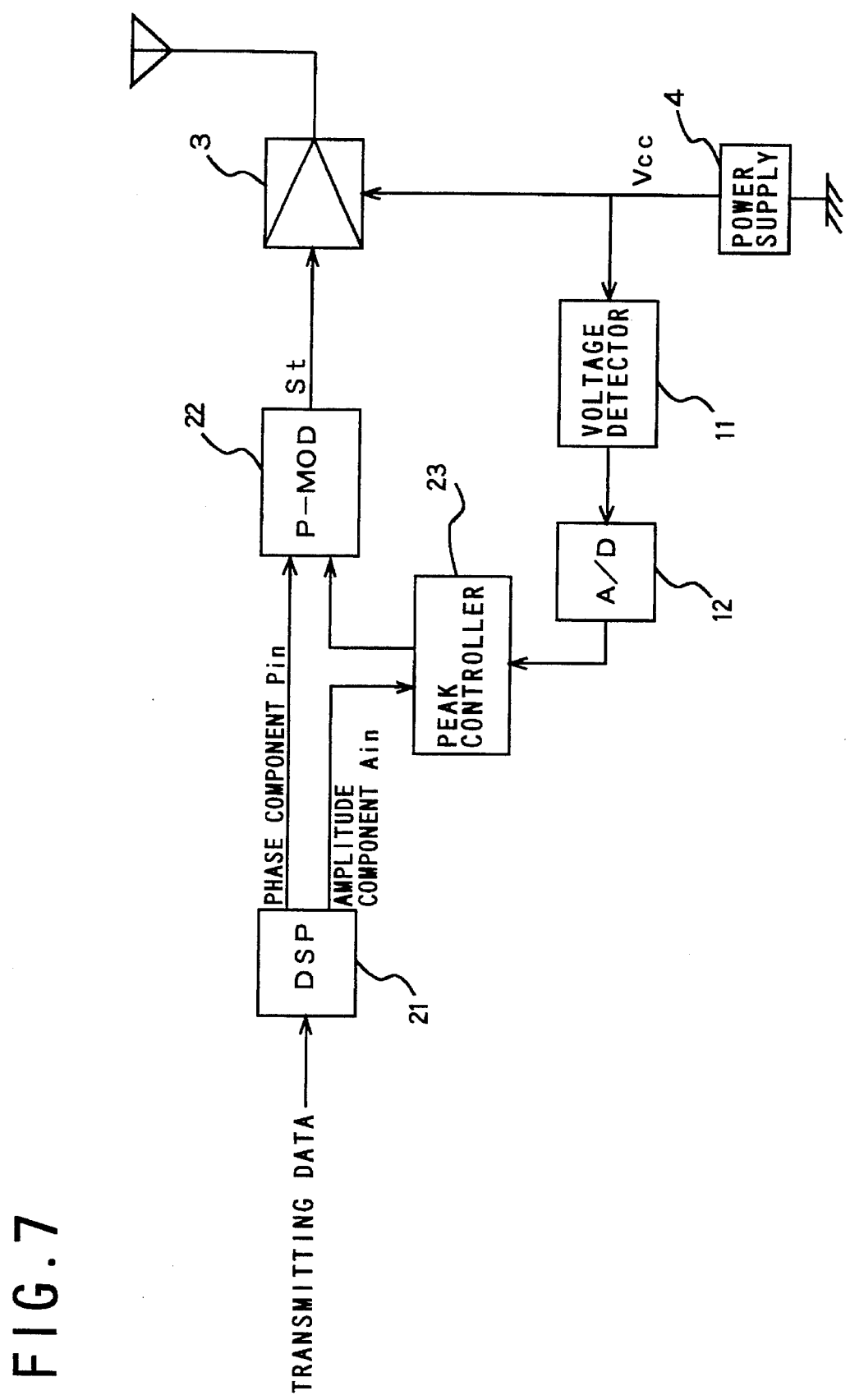
FIG. 7 is a block diagram showing a second embodiment of a transmitter according to the present invention.

FIG. 7 shows a second embodiment of a transmitter according to the present invention. In this embodiment, a polar coordinate modulation (or polar modulation) is used, and a DSP 21 generates a modulating signal consisting of a phase component and an amplitude component. The phase component of the modulating signal is input to a polar modulator 22, while the amplitude component of the same signal is subjected to the peak factor control by a peak controller 23 and thereafter input to the polar modulator 22. A modulated wave St is output from the polar modulator 22 to the transmission power amplifier 3.

The peak controller 23 is comprised of a processor and necessary memories (not shown) including a RAM and a ROM which is similar to the ROM 106 of FIG. 3 and stores amplitude reduction factors x (dB) in respect to an average power level $P_{av}$ of the modulated wave St, each amplitude reduction factor corresponding to the power supply voltage data Vcc. The peak controller 23 performs a peak factor control such that the amplitude component $A_{in}$ of the modulating signal is adjusted in accordance with a reduction amount of the power supply voltage Vcc.

Figure 8:
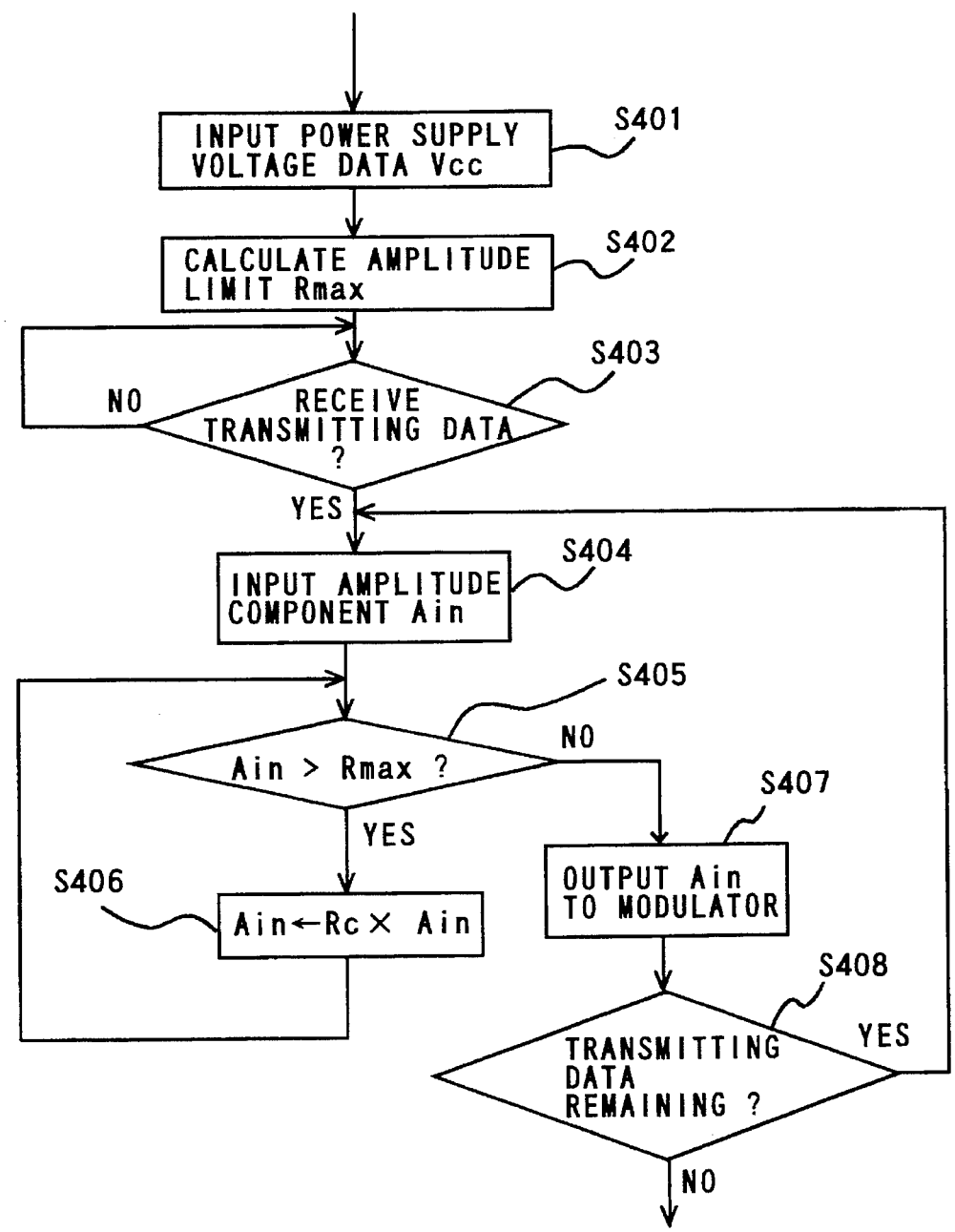
FIG. 8 is a flowchart showing a peak factor control of the transmitter as shown in FIG. 7.

FIG. 8 illustrates the peak factor control of the peak controller 23 of the transmitter shown in FIG. 7. As described before, receiving the power supply voltage data Vcc from the A/D converter 12 (S401), the peak controller 23 reads the amplitude reduction factor x (dB) from the ROM, calculates the amplitude limit Rmax using the following equation (S402):

$$Rmax=(P_{av}\times 10^{x/10})^{1/2},$$

and stores the result Rmax onto the RAM.

Receiving the transmitting data (Yes in S403), the peak controller 23 inputs the amplitude component $A_{in}(t)$ (S404) and determines whether the amplitude component $A_{in}(t)$ is greater than the amplitude limit Rmax (S405). If $A_{in}(t)$>Rmax, the peak reduction of the amplitude component is performed using the following equation (S406):

$$A_{in}(t)=Rc\times A_{in}(t)$$

where Rc is an appropriate compression ratio. Such a peak reduction step (S406) is repeated until the amplitude component $A_{in}$ is equal to or smaller than the amplitude limit Rmax.

If $A_{in}(t)$ is not larger than Rmax, the amplitude component $A_{in}(t)$ is output to the modulator 22 (S407) because the transmission power amplifier 3 can amplify the modulated wave St to a sufficient degree. If any transmitting data is remaining, the above steps are repeated until all the transmitting data are converted to the modulating signal (S408).

Binary Amplitude Modulation Transmitter

Figure 9:
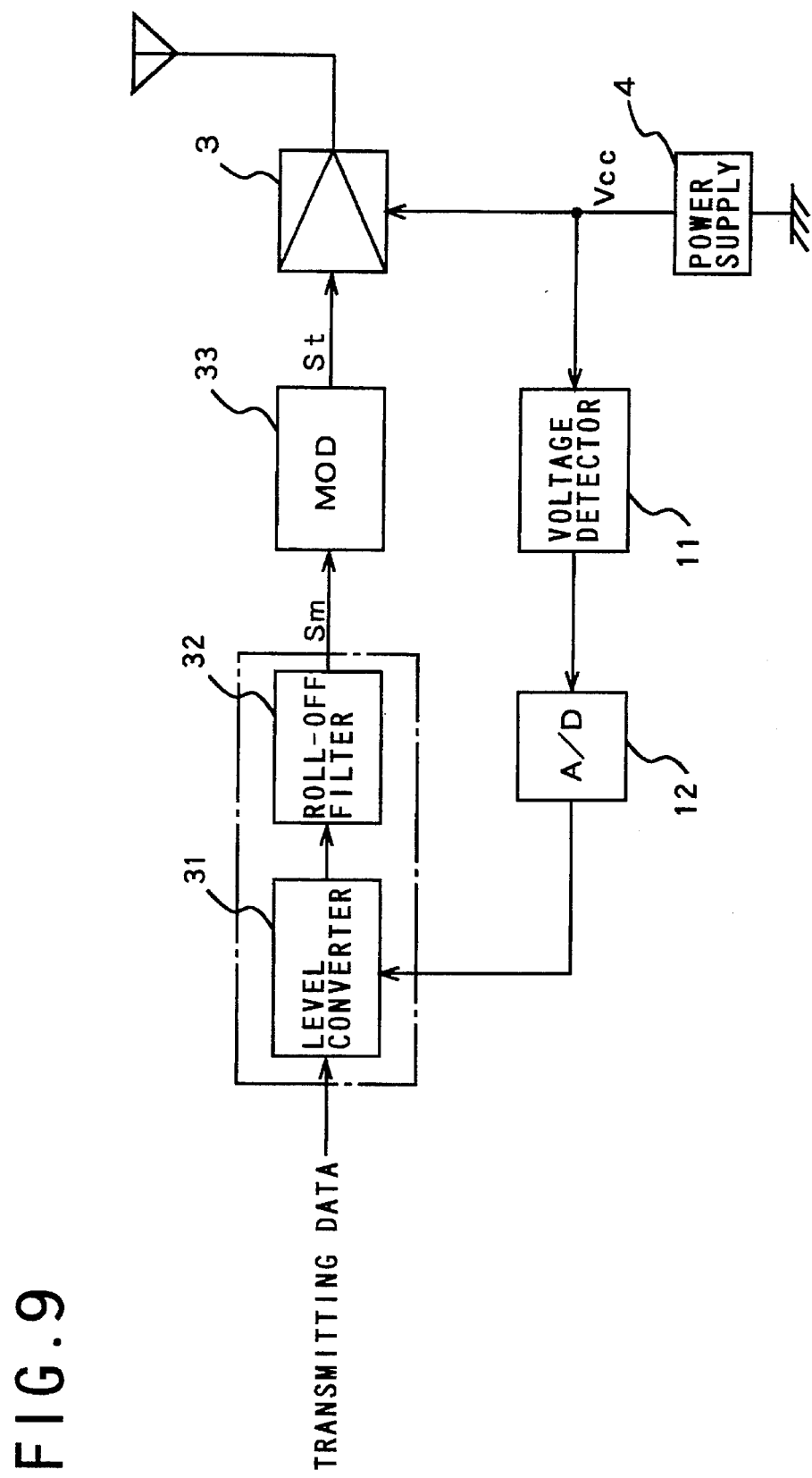
FIG. 9 is a block diagram showing a third embodiment of a transmitter according to the present invention.

FIG. 9 shows a third embodiment of a transmitter according to the present invention, In this embodiment, a binary amplitude modulation is employed. Although the binary amplitude modulation is rarely used in recent years, this modulation is easy to understand because of absence of the phase modulation component, and the effect according to the present invention is considerably expected when the information amount per one symbol is large.

Referring to FIG. 9, a modulating signal generator is comprised of a level converter 31 and a roll-off filter 32. The level converter 31 lowers a level of transmitting binary data in accordance with the reduction amount of the power supply voltage Vcc and consequently decrease the peak factor of the modulated signal St. The modulator 33 is, for example, a gilbert multiplier and subject the carrier wave to the binary amplitude modulation in accordance with the modulating signal Sm.

The level converter 31 is similar to the peak controller 23 of the transmitter as shown in FIG. 7. Therefore, the level control, that is, the peak control (see FIG. 8) performed by the level converter 31 is not described repeatedly.

Figure 10A:
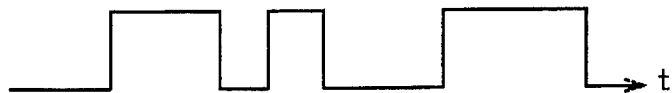
FIGS. 10A–10D are wave form charts used for explaining the operation of the third embodiment.
Figure 10B:
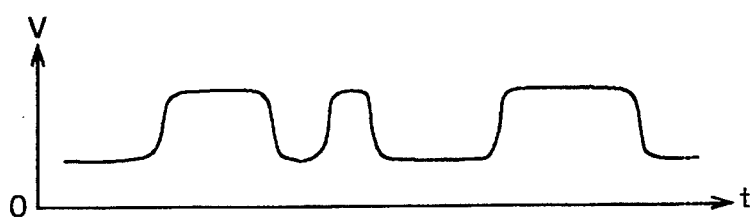
Figure 10C:
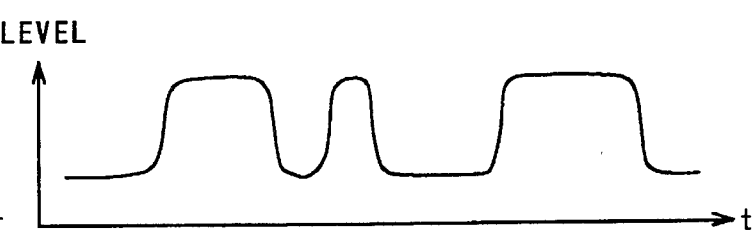

FIGS. 10A–10D show the operation of the transmitter. When the transmitting data such as shown in FIG. 10A are input, the modulating signal Sm such as shown in FIG. 10B corresponding to the binary data is generated through the level converter 31 and the roll-off filter 32. The modulated wave St is output from the modulator 33 in accordance with the modulating signal Sm, but the peak value in a high level is output as it is when the power supply voltage Vcc is not lowered, as shown in FIG. 10C.

Figure 10D:
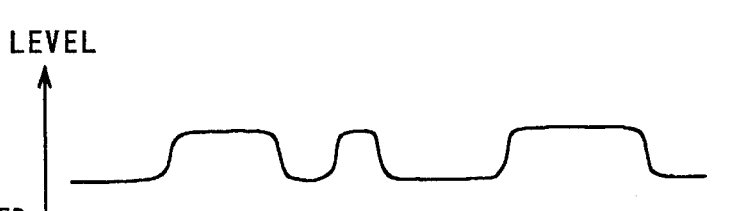

When the power supply voltage Vcc is reduced, the level converter 31 lowers the peak factor of the modulation signal Sm in accordance with the reduction amount of the power supply voltage Vcc, and the peak factor of the modulated signal St is consequently lowered as shown in FIG. 10D. The power amplification is thus enabled within the driving capability of the transmission power amplifier 3 even when the power supply voltage Vcc is lowered, thereby obtaining the transmitting wave including no distortion.

Figure 10E:
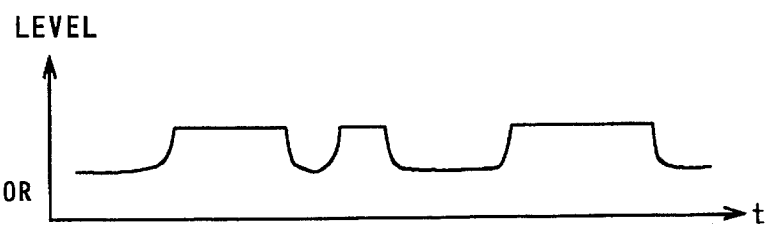
FIG. 10E is a wave form chart of a transmitting wave without peak factor control in the conventional transmitter of FIG. 1.

On the contrary, FIG. 10E illustrates a transmitting wave form obtained in a conventional transmitter having no peak factor control. If the peak factor is not controlled, the amplification can not be performed with respect to the modulating signal Sm in its peak when the reduction in the power supply voltage Vcc provokes the lowering of the driving capability of the power amplifier 3. The transmitting wave form thus becomes flat at the time of the peak as shown in FIG. 10E, and this distortion causes the transmitting wave to substantially increase in bandwidth, resulting in unstable transmission characteristics.

According to the present invention, since the peak value of the modulated wave St is lowered in accordance with the reduction in the power supply voltage as shown in FIG. 10D, the distortion of the transmitting wave form is not produced even after through the transmitting power amplifier 3.

While this invention has been described with reference to the illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method for generating a modulated wave in a transmitter having a power supply, the modulated wave including at least an amplitude component, the method comprising the steps of:

a) detecting a power supply voltage of the power supply;

b) determining an amplitude limit based on the power supply voltage;

c) generating a modulating signal based on transmitting data such that an amplitude of the modulated wave is restricted within the amplitude limit; and d) performing a modulation in accordance with the modulating signal to generate the modulated wave.

2. The method according to claim 1, wherein the step (b) comprises:

preparing a plurality of amplitude reduction factors in respect to an average power level of the modulated wave, each amplitude reduction factor corresponding to a power supply voltage of the power supply; and calculating the amplitude limit using an amplitude reduction factor corresponding to the power supply voltage detected.

3. The method according to claim 1, wherein the step (c) comprises:

calculating an estimated amplitude of the modulated wave corresponding to the transmitting data;

comparing the estimated amplitude with the amplitude limit; and changing the modulating signal using a ratio of the estimated amplitude to the amplitude limit if the estimated amplitude is greater than the amplitude limit.

4. The method according to claim 1, wherein the step (c) comprises:

calculating an estimated amplitude of the modulated wave corresponding to the transmitting data;

comparing the estimated amplitude with the amplitude limit;

repeating a step of compressing the estimated amplitude using a predetermined compression ratio until the estimated amplitude is not greater than the amplitude limit to obtain a compressed amplitude, if the estimated amplitude is greater than the amplitude limit; and changing the modulating signal according to the compressed amplitude.

5. The method according to claim 1, wherein the modulation is performed such that a carrier wave is modulated in accordance with the modulating signal.

6. The method according to claim 1, wherein the modulation is a quadrature modulation.

7. The method according to claim 6, wherein the modulation is a pi/4-shift QPSK (quadrature phase shift keying).

8. The method according to claim 6, wherein the modulation is a multivalue QAM (quadrature amplitude modulation).

9. The method according to claim 6, wherein the modulation is a multicarrier QAM.

10. The method according to claim 1, wherein the modulation is a polar modulation.

11. The method according to claim 1, wherein the modulation is a binary amplitude modulation.

12. The method according to claim 1, further comprising a step of amplifying the modulated wave in power for radio transmission.

13. An apparatus for generating a modulated wave in a transmitter having a power supply, the modulated wave including at least an amplitude component, the apparatus comprising:

detecting means for detecting a power supply voltage of the power supply;

determining means for determining an amplitude limit based on the power supply voltage;

generating means for generating a modulating signal based on transmitting data such that an amplitude of the modulated wave is restricted within the amplitude limit; and modulating means for modulating a carrier wave in accordance with the modulating signal to generate the modulated wave.

14. The apparatus according to claim 13, wherein the determining means comprises:

storage means for storing a plurality of amplitude reduction factors in respect to an average power level of the modulated wave, each amplitude reduction factor corresponding to a power supply voltage of the power supply; and calculation means for calculating the amplitude limit using an amplitude reduction factor corresponding to the power supply voltage detected by the detecting means.

15. The apparatus according to claim 13, further comprising amplifying means for amplifying the modulated wave in power for transmission.

16. The apparatus according to claim 13, wherein the modulating means is a quadrature modulator.

17. The apparatus according to claim 16, wherein the modulating means is a pi/4-shift QPSK modulator.

18. The apparatus according to claim 16, wherein the modulating means is a multivalue QAM modulator.

19. The apparatus according to claim 16, wherein the modulating means is a multicarrier QAM modulator.

20. The apparatus according to claim 13, wherein the modulating meansis a polar modulator.

21. The apparatus according to claim 13, wherein the modulating means is a binary amplitude modulator.

22. A transmitter comprising:
   a modulator for performing a modulation in accordance with a modulating signal to output a modulated wave which includes at least an amplitude component;
   a power amplifier for amplifying the modulated wave in power to output a transmitting wave;
   a power supply for supplying power to at least the power amplifier;
   detecting means for detecting a power supply voltage of the power supply;
   determining means for determining an amplitude limit based on the power supply voltage; and
   generating means for generating the modulating signal based on transmitting data such that an amplitude of the modulated wave is restricted within the amplitude limit.

23. The transmitter according to claim 22, wherein the determining means comprises:
   storage means for storing a plurality of amplitude reduction factors in respect to an average power level of the modulated wave, each amplitude reduction factor corresponding to a power supply voltage of the power supply; and
   calculation means for calculating the amplitude limit using an amplitude reduction factor corresponding to the power supply voltage detected by the detecting means.

24. The transmitter according to claim 22, wherein the modulator is a quadrature modulator.

25. The transmitter according to claim 24, wherein the modulator is a pi/4-shift QPSK modulator.

26. The transmitter according to claim 24, wherein the modulator is a multivalue QAM modulator.

27. The transmitter according to claim 24, wherein the modulator is a multicarrier QAM modulator.

28. The transmitter according to claim 22, wherein the modulator is a polar modulator.

29. The transmitter according to claim 22, wherein the modulator is a binary amplitude modulator.

* * * * *